United States Patent
Chatila et al.

[11] Patent Number: 6,016,012
[45] Date of Patent: Jan. 18, 2000

[54] THIN LINER LAYER PROVIDING REDUCED VIA RESISTANCE

[75] Inventors: Ahmad Chatila, Santa Clara; Kuantai Yeh; James M. Cleeves, both of Redwood City; Daniel Arnzen, Fremont; Roger Caldwell, Milpitas, all of Calif.

[73] Assignee: Cypress Semiconductor Corporation, San Jose, Calif.

[21] Appl. No.: 08/744,248

[22] Filed: Nov. 5, 1996

[51] Int. Cl.$^7$ ........................................... H01L 29/43
[52] U.S. Cl. .................. 257/775; 257/753; 438/668; 438/644
[58] Field of Search .................... 257/773, 774, 257/750, 753, 915, 775; 438/640, 668, 639, 644

[56] References Cited

U.S. PATENT DOCUMENTS

| | | | |
|---|---|---|---|
| 5,049,975 | 9/1991 | Ajika et al. | 257/764 |
| 5,081,064 | 1/1992 | Inoue et al. | 437/190 |
| 5,306,952 | 4/1994 | Matsuura et al. | 257/165 |
| 5,399,530 | 3/1995 | Kenmotsu | 437/195 |
| 5,468,342 | 11/1995 | Nulty et al. | 156/643.1 |
| 5,565,708 | 10/1996 | Ohsaki et al. | 257/764 |
| 5,569,961 | 10/1996 | Lee | 257/915 |
| 5,572,071 | 11/1996 | Lee | 257/915 |
| 5,594,278 | 1/1997 | Uchiyama | 257/915 |
| 5,625,231 | 4/1997 | Huang et al. | 257/915 |
| 5,652,464 | 7/1997 | Liao et al. | 257/751 |
| 5,689,140 | 11/1997 | Shoda | 257/751 |
| 5,691,571 | 11/1997 | Hirose et al. | 257/751 |
| 5,714,804 | 2/1998 | Miller et al. | 257/764 |
| 5,757,077 | 5/1998 | Chung et al. | 257/751 |
| 5,773,890 | 6/1998 | Uchiyama et al. | 257/751 |

OTHER PUBLICATIONS

IEEE, VMIC Conference, pp. 226–232, Jun. 12–13, 1990, T. Ohba, et al., "Selective and Blanket Tungsten Interconnection and its Suitability for 0.2–Micron ULSI".

Semiconductor International, pp. 57–61, Aug. 1994, Singer, "The Interconnect Challenge: Filling Small, High Aspect Ratio Contact Holes" (with English abstract).

Silicon Processing for the VLSI Era, vol. 2: Process Integration, pp. 246–248, Stanley Wolf, "Multilevel–Interconnect Technology for VLSI and ULSI".

*Primary Examiner*—David B. Hardy
*Attorney, Agent, or Firm*—Oblon, Spivak, McClelland, Maier & Neustadt, P.C.

[57] ABSTRACT

The present invention relates to semiconductor device containing a via and a method of forming a via in a semiconductor device.

24 Claims, 1 Drawing Sheet

THIN LINER LAYER PROVIDING REDUCED VIA RESISTANCE

BACKGROUND OF THE INVENTION

1. Field of the Invention

The present invention relates to a semiconductor device containing a via and a method of forming a via in a semiconductor device.

2. Discussion of the Background

During the semiconductor fabrication process multiple conductive layers such as metal or polysilicon are often deposited on a semiconductor substrate. Conductive layers are sometimes separated from each other by an insulating dielectric layer, such as silicon dioxide. These conductive layers are often selectively connected or "wired" together in order to allow for conduction of electricity in a desired pattern. One means of connecting conductive layers is through the formation of a via, which is a channel or plug of conductive material typically formed between layers of conductive materials.

A via may be formed by etching a channel in an insulating layer separating two conductive material layers and filling the channel with a conductive material.

During the formation of a via, a problem sometimes arises from high contact resistance at the bottom of the via, between the via material and the region of the conductive layer to which it contacts. In order to provide for a low contact resistance at the bottom of a via, it has been conventional to form thick layers of Ti (typically about 500–1,400 Å thick) by physical deposition methods such as sputtering. A thick layer has been used to ensure good contact between the Ti and the conductive region at the bottom of the via. (See for example Wolf Silicon Processing for the VLSI ERA, v2, pp 247–248 or U.S. Pat. No. 5,399,530).

In order to promote adherence of a via material to the Ti layer, it has also been known to use a glue layer as a transition between the titanium and the via material.

However, when a via having a high aspect ratio (height/width, or step height/step-step spacing) is used, it can be difficult to deposit a thick Ti layer and/or a glue layer into the via hole. These difficulties sometimes produce uneven deposition of materials in the via (i.e. cusping, voids, etc). It is also generally more difficult to completely avoid particulate impurities in vias having relatively high aspect ratios. Therefore, the electrical properties of such a high aspect ratio via can vary unpredictably resulting in uncontrolled changes in the resistivity. This is especially true at high aspect ratios, since the resistivity of the via may change in a manner depend ant on the aspect ratio of the via. The problem of filling small, high aspect ratio contact holes has been discussed by Singer in *Semiconductor International*, August 1994, p 57, "The Interconnect Challenge: Filling Small, High Aspect Ratio Contact Holes". Thus, a via-forming method that provides an aspect ratio-independent resistivity is valuable.

The present inventors have discovered that, contrary to conventional practice, a thin liner layer may be used in a high aspect ratio via, while still obtaining a low contact resistance between the via and the underlying material.

SUMMARY OF THE INVENTION

In one embodiment, the present invention concerns a semiconductor device, comprising:

i) a dielectric material;

ii) a channel formed in said dielectric material;

iii) a conductive material layer in said channel; and iv) a liner layer in said channel between said dielectric material and said conductive material, wherein said channel has an aspect ratio of $\geq 1.3$ and said liner layer has a thickness $\leq 500$ Å.

Another embodiment of the present invention concerns a method of forming a via, plug or contact having a low contact resistance.

A further embodiment of the present invention is directed to a method of forming a via, plug or contact with a relatively thin Ti layer, as compared to Ti layers conventionally used in relativley low aspect ratio (<1.0) vias.

These and other aspects of the present invention have been made possible by the discovery that a thin liner layer may be used in a high aspect ratio via, providing the via with a low contact resistance.

BRIEF DESCRIPTION OF THE DRAWINGS

A more complete appreciation of the invention any many of the attendant advantages thereof would be readily obtained as the same becomes better understood by reference to the following detailed description when considered in connection with the accompanying drawings, wherein.

wherein 1 is a dielectric material, 2 is a channel in a dielectric material, 3 is a conductive material layer formed in a channel; 4 is a liner layer in said channel formed between the dielectric material 1 and the conductive material layer 3; and 5 is a conductive region of a semiconductor device.

Figure 1A:
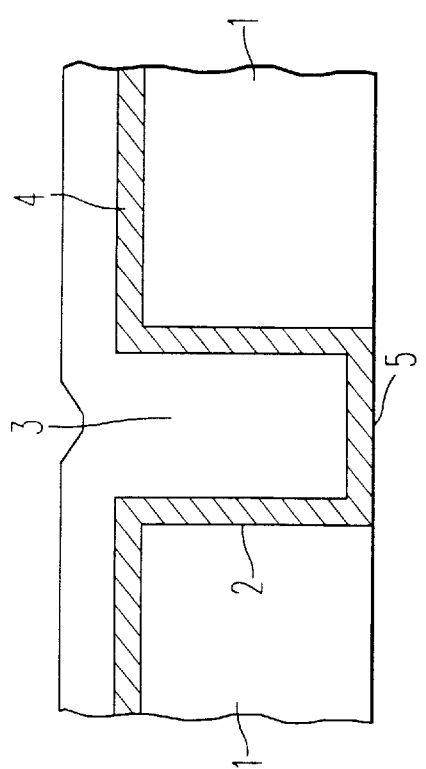
FIGS. 1(a) and 1(b) depict embodiments of semiconductor devices according to the present invention, where the liner layer covers the bottom of the channel FIG. 1(a) and where the liner layer does not extend to the bottom of the channel FIG. 1(b)
Figure 1B:
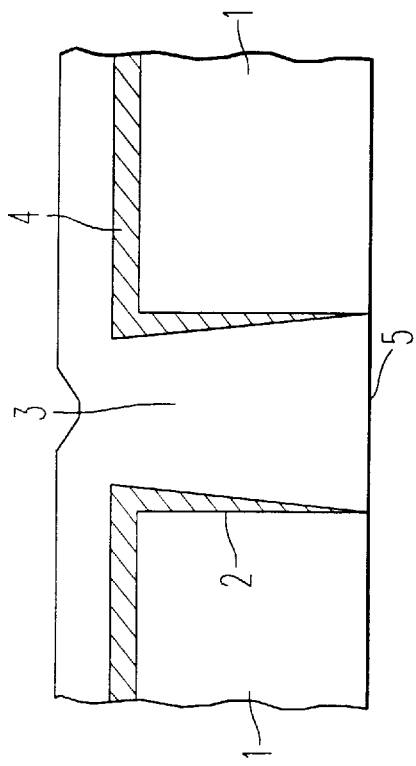
Figure 2A:
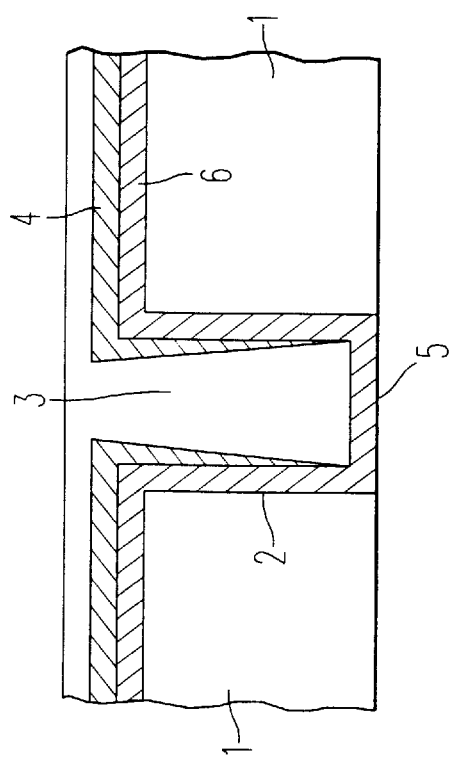
Figure 2B:
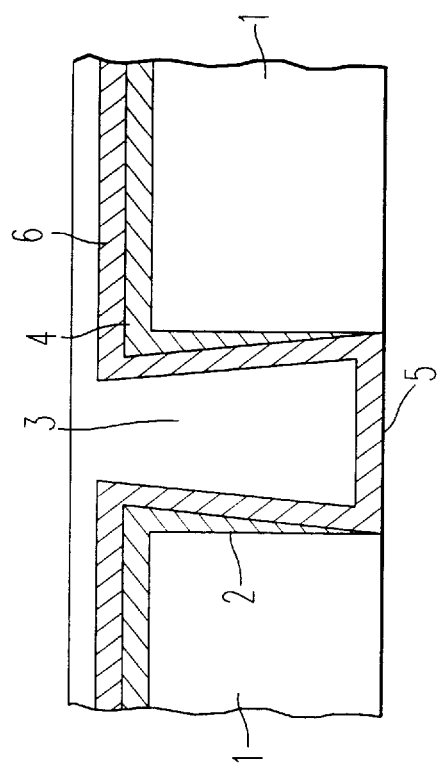

FIGS. 2(a) and 2) depict embodiments of semiconductor devices according to the present invention, wherein the second conductive material is disposed below the liner layer (FIG. 2(a) and above the liner layer FIG. 2(b)

wherein 6 is a second conductive material and 1, 2, 3, 4, and 5 are as defined above.

DETAILED DESCRIPTION OF THE PREFERRED EMBODIMENTS

A via, plug or contact according to the present invention (hereinafter, "via") is provided between conductive layers or regions of a semiconductor device, which are separated by an insulating material such as a dielectric material (e.g silicon oxide, $Si_3N_4$, silicon oxynitrides (e.g. of the general formula $[Si_aO_xN_y]$ such that $(x/2)+(3y/4)=a$), $Al_2O_3$, aluminum nitride [e.g. AlN], aluminum oxynitrides (e.g. of the general formula $[Al_bO_xN_y]$ such that $(2x/3)+y=b$), alumino-silicates and nitrides thereof (e.g. of the general formula $[Si_aAl_bO_xN_y]$ where $x=2a+3b/2$ and $y=4a/3+b$), boron- and/or phosphorous-doped silicates, aluminates and aluminosilicates, etc.). Non-limiting examples of conductive layers or regions to which a via may be connected include a source or a drain region of a silicon, germanium or GaAs substrate (which may be lightly, heavily or very heavily doped with conventional N-dopants [such as nitrogen, phosphorous, arsenic, antimony, bismuth, tellurium, sulfur, mixtures thereof etc.] or P-dopants [such as B, Al, Ga, In, mixtures thereof, etc.], the gate of a gate electrode, a second contact (which may be self-aligned), a metallization layer and a local interconnect.

According to the present invention, a via may be formed in an insulating material to a region of a semiconductor device. A via channel may be formed by conventional techniques known to those of ordinary skill in the art such as by conventional masking and etching techniques.

A non-limiting example of a method of forming a via channel follows:

A resist material may be deposited and/or patterned onto a dielectric and/or passivation layer of a layered structure. The layered structure may comprise, from top to bottom, the dielectric and an Si substrate (which may have conventionally doped (semi)conductive regions). The layered structure may further comprise from top to bottom, (a) a metal and/or polysilicon layer, and/or (b) an intermediate dielectric layer (ILD) such as a conventional field or gate oxide, disposed between the dielectric and substrate. After deposition and/or patterning of resist material, the exposed regions may be etched to form the via channel. Examples of resist materials may be those conventionally known to those of ordinary skill in the art, including those conventionally used in the area of photolithography.

Negative resist materials may contain chemically inert polymer components such as rubber and/or photoreactive agents that react with light to form cross-links, e.g. with the rubber. When placed in an organic developer solvent, the unexposed and unpolymerized resist dissolves, leaving a polymeric pattern in the exposed regions. The preparation and deposition of negative resist materials is within the level of skill of one of ordinary skill in the art and can be performed without undue experimentation. Specific non-limiting examples of negative resist systems include cresol epoxy novolac-based negative resists, as well as negative resists containing one or more photoreactive polymers as described in Kirk-Othmer Encyclopedia of Chemical Technology, 3rd Edition, vol 17, entitled "Photoreactive Polymers", pages 680–708, the relevant portions of which are hereby incorporated by references.

Positive resists have photoreactive components which are destroyed in the regions exposed to light. Typically the resist is removed in an aqueous alkaline solution, where the exposed region dissolves away. The preparation and deposition of positive resist materials is within the level of skill of one of ordinary skill in the art and can be performed without undue experimentation. Specific non-limiting examples of suitable positive resist systems include Shipley XP9402, JSR KRK-K2G and JSR KRF-L7 positive resists, as well as positive resists containing one or more photoreactive polymers as described in Kirk-Othmer Encyclopedia of Chemical Technology, 3rd Edition, vol 17, entitled "Photoreactive Polymers", pages 680–708, the relevant portions of which are hereby incorporated by references.

Examples of resist materials are also described by Bayer et al, IBM Tech. Discl. Bull (USA) vol 22, No 5 October 1979 pp 1855; Tabei, U.S. Pat. No. 4,613,404; Taylor et al, J. Vac. Sci, Technol. B. Vol 13, No. 6, 1995 pp 3078–3081; Argitis et al, J. Vac. Sci, Technol. B. Vol 13, No. 6, 1995 pp 3030–3034; Itani et al, J. Vac. Sci, Technol. B. Vol 13, No. 6, 1995 pp 3026–3029; Ohfuji et al, J. Vac. Sci, Technol. B. Vol 13, No. 6, 1995 pp 3022–3025; Trichkov et al, J. Vac. Sci, Technol. B. Vol 13, No. 6, 1995 pp 2986–2993; Capodieci et al, J. Vac. Sci, Technol. B. Vol 13, No. 6, 1995 pp 2963–2967; Zuniga et al, J. Vac. Sci, Technol. B. Vol 13, No. 6, 1995 pp 2957–2962; Xiao et al, J. Vac. Sci, Technol. B. Vol 13, No. 6, 1995 pp 2897–2903; Tan et al J. Vac. Sci, Technol. B. Vol 13, No. 6, 1995 pp 2539–2544; and Mayone et al J. Vac. Sci, Technol. Vol 12, No. 6, 1995 pp 1382–1382.

The relevant portions of the above-identified references which describe the preparation and deposition of resist materials is hereby incorporated by reference. Selection of a resist material for the particular etching conditions is within the level of skill of one of ordinary skill in the art and can be performed without undue experimentation.

Etching of the exposed dielectric material, including stopping at the conductive layer or region, may be conducted under conditions known to those of ordinary skill in the art, depending on the nature of the dielectric material to be etched and the nature of the underlying conductive layer or region. For example, the layered structure may include an etch stop layer (such as a titanium tungsten alloy (TiW), $Si_3N_4$, copper, nickel, cobalt or a noble metal such as ruthenium, rhodium, palladium, osmium, iridium, platinum, gold or silver) positioned directly above the layer not to be etched, such as a metal, a dielectric layer, a substrate material or a selected portion thereof. Etchants such as $SF_6$, $Cl_2$, $C_nH_xF_y$ (where $y \geq 1$, and $x+y=2n+2$, preferably a mixture of $CHF_3/C_2F_6$ [see, for example, U.S. Pat. No. 08/683,407, and/or U.S. Pat. No. 5,468,342, the relevant portions of which are hereby incorporated by reference]), HF, HCl or $CCl_4$ may be used in conventional reactive ion etching. Etching may also be conducted by conventional RF etching. In a preferred embodiment, etching is conducted using a commercially available plasma etcher (e.g. from DRYTEK, Inc. of Wilmington, Mass. and Santa Clara, Calif.) and a $CHF_3/C_2F_6$ etch chemistry according to the manufacturer's instructions.

Examples of dielectric materials include conventional oxides, nitrides, oxynitrides, and other dielectrics, such as borophosphosilicate glass (BPSG), borosilicate glass (BSG), phosphosilicate glass, spin-on glass (SOG), silicon oxide, P-doped silicon oxide (P-glass), silicon nitride ($Si_xN_y$), silicon dioxide, a conventional oxide/nitride/oxide structure, silicon oxynitride (e.g. of the general formula $[Si_aO_xN_y]$ such that $(x/2)+(3y/4)=a$), $Al_2O_3$, metal nitrides such as aluminum nitride [e.g. AlN], $Si_3N_4$, $V_2O_5$, tetraethylorthosilicate-based oxides and titanium oxide, aluminum oxynitrides (e.g. of the general formula $[Al_bO_xN_y]$ such that $(2x/3)+y=b$), aluminosilicates and nitrides thereof (e.g. of the general formula $[Si_aAl_bO_xN_y]$ where $x=2a+3b/2$ and $y=4a/3+b$), boron- and/or phosphorous-doped silicates, aluminates and aluminosilicates.

The thickness of dielectric layer is not particularly limited, but preferably is in the range of about 0.3–3 μm, more preferably 0.5–2 μm, even more preferably 0.7 to 1.5 μm. The dielectric layer may comprise a single dielectric material. However, it may also comprise multiple layers of the same or different dielectric materials.

The aspect ratio (height/width or step height/step-step spacing) of the via channel according to the present invention is preferably $\geq 1.3$, more preferably $\geq 1.5$, even more preferably $\geq 1.7$, and most preferably $\geq 2.0$. Specific examples of aspect ratios are 1.3, 1.4, 1.5, 1.6, 1.7, 1.8, 1.9, 2.0, 2.1, 2.2, 2.3, 2.4, 2.5, 2.6, 2.7, 2.8, 2.9, 3.0, 3.1, 3.2, 3.3, 3.4, 3.5, 3.6, 3.7, 3.8, 3.9, 4.0, 4.1, 4.2, 4.3, 4.4, 4.5, 4.6, 4.7, 4.8, 4.9, 5.0, 5.1, 5.2, 5.3, 5.4, 5.5 etc.

The diameter of the hole formed for the via channel is not particularly limited. However, the diameter of the via channel is preferably from 0.1 to 2 μm, more preferably from 0.2 to 1 μm. Specific examples of the diameter of the hole of the via are 0.10, 0.15, 0.20, 0.25, 0.30, 0.35, 0.40, 0.45, 0.50, 0.55, 0.60, 0.65, 0.70, 0.75, 0.80, 0.85, 0.90, 0.95, 1.00, 1.05, 1.10, 1.15, 1.20, 1.25, 1.30, 1.35, 1.40, 1.45, 1.50, 1.55, 1.60, 1.65, 1.70, 1.75, 1.80, 1.85, 1.90, 1.95 and 2.0 μm.

After a via channel has been etched in the dielectric material, a liner layer material may be deposited into the via channel.

Non-limiting examples of suitable liner layer materials are titanium, zirconium, hafnium, chromium, molybdenum, tungsten, copper, nickel, cobalt or noble metals such as ruthenium, rhodium, palladium, osmium, iridium, platinum, gold and silver, alloys thereof such as titanium-tungsten and titanium nitride. The liner layer may promote adherence of the via conductive material to the side walls of the dielctric material as well as to the material of the conductive layer or region therebelow (e.g. a metal such as tungsten or Al or doped polysilicon). Preferably the liner layer is a titanium-tungsten alloy or titanium nitride.

The liner layer may be deposited by conventional methods known to those of ordinary skill in the art such as chemical or plasma vapor deposition, ionized metal plasma, sputtering, etch sputtering, etc.

While the liner layer may be deposited in an amount sufficient to cover the entire exposed surface of the wafer, within the scope of the present invention it is preferably deposited in an amount sufficient to cover the uppermost surface of the dielectric layer and on the side walls of the via channel.

The thickness of the liner layer as deposited on the uppermost surface of the dielectric layer (i.e, the surface of the dielectric layer away from the surface contacting or closest to the underlying conductive region) is less than or equal to 500 Å, preferably less than 450 Å, more preferably less than 400 Å, even more preferably 100–300 Å. The thickness of the liner layer (or any other layer) may also be an average thickness. However, the thickness of the liner layer at the bottom of the via is <500 Å, preferably <300 Å, more preferably <100 Å, and most preferably about 0 Å. Thus, the method for depositing the liner layer is preferably a sputtering or vapor deposition method that deposits less material at the bottom of the via than on the upper surface of the surrounding dielectric layer and/or on the sidewalls. This may exclude collimated sputtering as a process for depositing the liner layer material.

The thickness of the liner layer on the side walls is typically, but not necessarily, greater than that deposited at the bottom of the via channel. In a prefered embodiment, the ratio of the average thickness of the liner layer deposited on the side wall to the average thickness of the liner layer deposited at the bottom of the via channel >1, even more preferably ≧1.2.

Within the context of the present invention, the liner layer will appear, at least, between the dielectric material and the conductive material of the via. However, the liner layer need not form a contiguous barrier between the dielectric material and the conductive material of the via and may appear on only a portion or portions of the side wall of the dielectric material.

Before and/or after deposition of the liner layer, it is possible to deposit a layer of an additional conductive material having a thickness of the dimensions described for the liner layer (on the sidewalls and dielectric surface (≦500 Å, preferably ≦450 Å, more preferably ≦400 Å, and most preferably 100–300 Å), at the via bottom, <500 Å, preferably <300 Å, more preferably 100 Å, and most preferably ~0 Å). The additional conductive material may form a barrier to migration of atoms from materials below the additional conductive material to materials above the additional conductive material, and/or may serve as an etch stop layer. Non-limiting examples of suitable additional conductive materials include titanium, zirconium, hafnium, chromium, molybdenum, tungsten, aluminum, copper, nickel, cobalt or noble metals such as ruthenium, rhodium, palladium, osmium, iridium, platinum, gold and silver, silicides thereof, conductive refractory nitrides thereof, etc. Preferably, the additional conductive material layer is titanium.

The additional conductive material layer may be formed by conventional physical vapor deposition techniques known to those of ordinary skill in the art, preferably those preferred for depositing the present liner layer. In particular, such a layer may be formed by conventional or etch sputtering.

After the liner layer has been deposited, a contact or plug may be formed by depositing a conductive material into the via channel.

Non-limiting examples of suitable conductive materials are titanium, zirconium, hafnium, chromium, molybdenum, tungsten, aluminum, polysilicon, copper, alloys thereof such as titanium-tungsten, tungsten silicide, titanium silicide etc. Preferably the conductive material is tungsten or aluminum.

The conductive material may be deposited by conventional methods known to those of ordinary skill in the art, such as by atmospheric pressure Chemical Vapor Deposition (APCVD), low pressure Chemical Vapor Deposition (LPCVD), plasma-enhanced Chemical Vapor Deposition (EPCVD), conventional sputtering, collimated sputtering, or thermal or epitaxial growth. Preferably the conductive material is deposited by chemical vapor deposition. When tungsten is deposited, a reactive gas mixture comprising $WF_6$ and $SiH_4$ (which may further comprise $H_2$) may be used.

After deposition of the conductive material, further processing may include an etch back or plan a irization step, preferably planarizing using conventional Chemical Mechanical Polishing (CMP).

Surprisingly, a liner layer of <500 Å thickness provides good adherence of the via material without adversely affecting via and/or contact resistivity. A via, contact or plug according to the present invention preferably has a resistance of $\leq 10^3$ Ω·cm preferably $\leq 10^2$ Ω·cm, more preferably $\leq 10^1$ Ω·cm, even more preferably $\leq 1$ Ω·cm.

The present method offers advantages of lower cost in the use of small amounts of additional conductive material and liner material, low via resistance, and smaller variations in resistance.

What is claimed as new and desired to be secured by Letters Patent of the United States is:

1. A semiconductor device, comprising:
   i) a dielectric material;
   ii) a channel formed in said dielectric material;
   iii) a conductive material layer in said channel;
   iv) a liner layer in said channel between said dielectric material and said conductive material deposited on a surface of said dielectric material; and
   v) a second conductive material layer disposed between said liner layer and a bottom of said channel, wherein said second conductive material layer has a thickness ≦500 Å,
      wherein said channel has an aspect ratio of ≧1.3 and said liner layer has a thickness ≧500 Å and a thickness at a bottom of said channel of <100 Å,
   and wherein said liner layer comprises an element selected from the group consisting of zirconium, hafnium, aluminum, chromium, molybdenum, tungsten, copper, nickel, cobalt, ruthenium, rhodium, palladium, osmium, iridium, platinum, gold, silver, titanium-tungsten alloy and titanium nitride.

2. The semiconductor device of claim 1, further comprising a second conductive material layer disposed between said liner layer and a bottom of said channel wherein said second conductive material layer has a thickness $\leqq 500$ Å.

3. The semiconductor device of claim 1, further comprising a third conductive layer disposed below said dielectric material.

4. The semiconductor device of claim 1, further comprising a third conductive layer disposed above said dielectric material.

5. The semiconductor device of claim 1, wherein said conductive material layer comprises tungsten or aluminum.

6. The semiconductor device of claim 1, wherein said second conductive material layer comprises an element selected from the group consisting of titanium, aluminum, chromium, tungsten, molybdenum, copper, nickel, cobalt, ruthenium, rhodium, palladium, osmium, iridium, platinum, gold and silver or an alloy thereof.

7. The semiconductor device of claim 1, wherein said via has an aspect ratio of $\geqq 1.5$.

8. The semiconductor device of claim 1, wherein said channel has an aspect ratio of $\geqq 1.7$.

9. The semiconductor device of claim 1, wherein said channel has an aspect ratio of $\geqq 2.0$.

10. The semiconductor device of claim 1 wherein said channel forms a via which has a resistivity of $\leqq 10^3$ Ω·cm.

11. The semiconductor device of claim 1 wherein said channel forms a via which has a resistivity of $\leqq 10^2$ Ω·cm.

12. The semiconductor device of claim 1 wherein said channel forms a via which has a resistivity of $\leqq 10^1$ Ω·cm.

13. The semiconductor device of claim 1 comprising at least two of said channels.

14. The semiconductor device of claim 1, wherein said liner layer has a thickness <450 Å.

15. The semiconductor device of claim 1, wherein said liner layer has a thickness <400 Å.

16. The semiconductor device of claim 1, wherein said liner layer has a thickness of 100–300 Å.

17. The semiconductor device of claim 1, wherein said liner layer has a thickness at a bottom of said channel of <500 Å.

18. The semiconductor device of claim 1, wherein said liner layer has a thickness at a bottom of said channel of <300 Å.

19. The semiconductor device of claim 1, wherein said liner layer is deposited by a technique other than collimated sputtering.

20. The semiconductor device of claim 1, wherein said liner layer comprises an element selected from the group consisting of titanium-tungsten alloy and titanium nitride.

21. The semiconductor device of claim 1, wherein said liner layer comprises an element selected from the group consisting of titanium-tungsten alloy.

22. A semiconductor device, comprising:
   i) a dielectric material;
   ii) a channel formed in said dielectric material;
   iii) a conductive material layer in said channel; and
   iv) a liner layer in said channel between said dielectric material and said conductive material deposited on a surface of said dielectric material;
   wherein said channel has an aspect ratio of $\geqq 1.3$ and said liner layer has a thickness $\leqq 500$ Å and a thickness at a bottom of said channel of about 0 Å,
   and wherein said liner layer comprises an element selected from the group consisting of zirconium, hafnium, aluminum, chromium, molybdenum, tungsten, copper, nickel, cobalt, ruthenium, rhodium, palladium, osmium, iridium, platinum, gold, silver, titanium-tungsten alloy and titanium nitride.

23. A method of forming a semiconductor device comprising a via comprising:
   a) depositing a liner layer having a thickness <500 Å in a via channel having an aspect ratio of $\geqq 1.3$; and
   b) filling said via channel with a conductive material,
   wherein said semiconductor device comprises:
   i) a dielectric material;
   ii) a channel formed in said dielectric material;
   iii) a conductive material layer in said channel;
   iv) a liner layer in said channel between said dielectric material and said conductive material deposited on a surface of said dielectric material; and
   v) a second conductive material layer disposed between said liner layer and a bottom of said channel, wherein said second conductive material layer has a thickness $\leqq 500$ Å,
   wherein said channel has an aspect ratio of $\geqq 1.3$ and said liner layer has a thickness $\leqq 500$ Å and a thickness at a bottom of said channel of <100 Å,
   and wherein said liner layer comprises an element selected from the group consisting of zirconium, hafnium, aluminum, chromium, molybdenum, tungsten, copper, nickel, cobalt, ruthenium, rhodium, palladium, osmium, iridium, platinum, gold, silver, titanium-tungsten alloy and titanium nitride.

24. A method of forming a semiconductor device comprising a via comprising:
   a) depositing a liner layer having a thickness <500 Å in a via channel having an aspect ratio of $\geqq 1.3$; and
   b) filling said via channel with a conductive material,
   wherein said semiconductor device comprises:
   i) a dielectric material;
   ii) a channel formed in said dielectric material;
   iii) a conductive material layer in said channel; and
   iv) a liner layer in said channel between said dielectric material and said conductive material deposited on a surface of said dielectric material;
   wherein said channel has an aspect ratio of $\geqq 1.3$ and said liner layer has a thickness $\leqq 500$ Å and a thickness at a bottom of said channel of about 0 Å,
   and wherein said liner layer comprises an element selected from the group consisting of zirconium, hafnium, aluminum, chromium, molybdenum, tungsten, copper, nickel, cobalt, ruthenium, rhodium, palladium, osmium, iridium, platinum, gold, silver, titanium-tungsten alloy and titanium nitride.

* * * * *